United States Patent
Grenouillet et al.

(10) Patent No.: US 10,347,545 B2
(45) Date of Patent: Jul. 9, 2019

(54) METHOD FOR PRODUCING ON THE SAME TRANSISTORS SUBSTRATE HAVING DIFFERENT CHARACTERISTICS

(71) Applicant: Commissariat A L'Energie Atomique et aux Energies Alternatives, Paris (FR)

(72) Inventors: Laurent Grenouillet, Claix (FR); Sebastien Barnola, Villard Bonnot (FR); Marie-Anne Jaud, Claix (FR); Jerome Mazurier, Cestas (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/599,944

(22) Filed: May 19, 2017

(65) Prior Publication Data
US 2017/0358502 A1    Dec. 14, 2017

(30) Foreign Application Priority Data
May 20, 2016 (FR) ..................... 16 54554

(51) Int. Cl.
*H01L 21/28* (2006.01)
*H01L 21/84* (2006.01)
(Continued)

(52) U.S. Cl.
CPC ........ *H01L 21/84* (2013.01); *H01L 21/28123* (2013.01); *H01L 27/1203* (2013.01);
(Continued)

(58) Field of Classification Search
CPC ............... H01L 21/28123; H01L 21/84; H01L 27/1203; H01L 29/42364; H01L 29/4983;
(Continued)

(56) References Cited

U.S. PATENT DOCUMENTS 8,766,371 B2 * 7/2014 Zhu ................ H01L 21/823807
257/369
2006/0205134 A1   9/2006 Nishimura
(Continued)

FOREIGN PATENT DOCUMENTS

WO    WO 2012/046365      *  4/2012
WO    WO 2012/046365 A1     4/2012
(Continued)

OTHER PUBLICATIONS

French Preliminary Search Report dated Jan. 10, 2017 in French Application 16 54554, filed on May 20, 2016 ( with English Translation of Categories of Cited Documents and Written opinion).

*Primary Examiner* — Matthew L Reames
*Assistant Examiner* — Benjamin T Liu
(74) *Attorney, Agent, or Firm* — Oblon, McClelland, Maier & Neustadt, L.L.P.

(57) ABSTRACT

There is provided a method for producing on a same substrate at least one first transistor and at least one second transistor that have different characteristics, the method including producing at least one first gate pattern and at least one second gate pattern on the substrate; depositing, on the first and the second gate patterns, at least: a first protective layer, and a second protective layer overlying the first protective layer and made of a material different from that of the first protective layer; masking of the second gate pattern by a masking layer; isotropic etching of the second protective layer; removing the masking layer; and anisotropic etching of the second protective layer selectively relative to the first protective layer.

21 Claims, 8 Drawing Sheets

(51) Int. Cl.
*H01L 27/12* (2006.01)
*H01L 29/423* (2006.01)
*H01L 29/49* (2006.01)
*H01L 29/78* (2006.01)
*H01L 29/66* (2006.01)

(52) U.S. Cl.
CPC .... *H01L 29/42364* (2013.01); *H01L 29/4983* (2013.01); *H01L 29/6653* (2013.01); *H01L 29/6656* (2013.01); *H01L 29/66772* (2013.01); *H01L 29/7838* (2013.01)

(58) Field of Classification Search
CPC ........... H01L 29/7838; H01L 29/66772; H01L 29/6656; H01L 29/6653
See application file for complete search history.

(56) References Cited

U.S. PATENT DOCUMENTS

| | | | |
|---|---|---|---|
| 2012/0132998 A1* | 5/2012 | Kwon | H01L 21/28088 257/369 |
| 2015/0035072 A1 | 2/2015 | Dutta et al. | |
| 2016/0035843 A1* | 2/2016 | Vinet | H01L 21/84 438/154 |
| 2016/0126240 A1 | 5/2016 | Dutta et al. | |

FOREIGN PATENT DOCUMENTS

| | | | | |
|---|---|---|---|---|
| WO | WO-2012046365 A1 * | 4/2012 | ..... | H01L 21/823456 |
| WO | WO 2014/162164 A1 | 10/2014 | | |

\* cited by examiner

METHOD FOR PRODUCING ON THE SAME TRANSISTORS SUBSTRATE HAVING DIFFERENT CHARACTERISTICS

TECHNICAL FIELD OF THE INVENTION

This invention relates to the realization on the same substrate of transistors that have different characteristics, for example gate oxides of which the thicknesses are different. It will have advantageous application in the realization of such transistors on a substrate of the FDSOI type.

PRIOR ART

For certain circuits, it is necessary to realize on the same elaborated substrate, also designated as a wafer, transistors that have different characteristics, for example different gate oxide thicknesses.

Elaborated substrates generally comprise a support substrate overmounted with a layer of oxide and with a semiconductor layer of which the thickness is thin. They are qualified as FDSOI (fully depleted silicon on insulator) or PDSOI (partially depleted silicon on insulator) according primarily to the thickness of the semiconductor layer.

The transistors that are realized on this type of elaborated substrates have a gate stack that comprises in particular a gate that is usually made of doped silicon or of metal, a metal layer and an electrically insulating layer referred to as gate oxide located between the active layer and the polycrystalline silicon gate.

On the same elaborated substrate, transistors of a first type can be produced that have a different characteristic from that of a second type of transistor. For example it is possible to produce, on the same substrate, transistors of a first type that have a first gate oxide thickness and transistors of a second type that have a second gate oxide thickness greater than the first thickness in order to operate at higher voltages.

In order to limit the complexity of the method, many steps are common to the production of the two types of transistors of which in particular the realization of the metal layer, the polysilicon gate, the spacers, the sources and drains.

This invention has for objective to propose a solution for integrating in a reproducible and simple manner, on the same substrate, transistors that have different characteristics, for example gate oxides of which the thicknesses are different.

SUMMARY OF THE INVENTION

In order to achieve this objective, according to an embodiment this invention provides for a method of realizing on the same substrate preferably of the semiconductor-on-insulator type of at least one first transistor and of at least one second transistor, with the method comprising at least the following steps:
  Realization on a substrate of the semi-conductor-on-insulator type of at least one first gate pattern and of at least one second gate pattern;
  Deposition on the first and the second gate patterns of at least:
    one first protective layer,
    a second protective layer overmounting the first protective layer and made of a material different from that of the first protective layer and;
  Masking of the second pattern by a masking layer;
  Isotropic etching of the second protective layer located on the first pattern, by retaining the first protective layer on the first pattern, the second pattern being masked by the masking layer during this isotropic etching;
  Removal of the masking layer after the step of isotropic etching;
  Before the step of masking or after the step of removing the masking layer: anisotropic etching of the second protective layer selectively to the first protective layer, in such a way as to remove at least a portion, preferably all, the second protective layer located on a top of the second gate pattern and to retain at least a portion of, preferably all, the thickness of the second protective layer located on the sides of the second gate pattern.

As such, the method according to the invention makes it possible to realize on the sides of the second pattern spacers with a more substantial thickness than on the sides of the first pattern.

This invention as such proposes a solution for integrating in a reproducible and simple manner, on the same substrate, transistors that have different characteristics.

It offers a particularly interesting advantage for the realization on the same substrate of transistors of which the gate stacks have insulating layers, typically gate oxides, of which the thicknesses are different. In practice, it has been observed that with the known solutions, very often the performance of transistors of which the gate oxides are thicker degrade as they are used.

Consequently, with the known solutions, the performances and the service life of devices that comprise these transistors can represent a barrier to the industrialization thereof.

In the framework of the development of this invention, it was noted that with the known solutions, in the transistor that has a gate stack of which the gate oxide is the thickest, the electric field is the highest at the interface between source/drain and spacers and not at the level of the gate oxide, as was foreseeable.

This strong electric field can result in the breakdown of the spacer as the transistor operates.

By providing a thicker spacer of the sides of the gate of the second transistor that has to support higher voltages, the invention makes it possible to suppress this risk of breakdown.

Moreover, the invention makes it possible to retain on the sides of the gate of the first transistor a thin spacer thickness. The invention makes it possible as such to retain the performance of the transistors of which the gate oxides are the thinnest.

The method according to the invention also makes it possible to be integrated perfectly in the standard methods in which the sides of the first gate pattern are covered by single-layer spacers.

Furthermore, the invention has a limited complexity with respect to conventional solutions wherein the gate spacers on the sides of the first and second transistors are of identical thicknesses. In particular the method according to the invention does not require an additional lithography mask. In particular, advantageously, the level of the mask that makes it possible to introduce the difference in thickness on the spacer is the same as the one use to induce the difference in gate oxide.

Furthermore this method does not require any additional overetching that could deteriorate the active layer. As such, the invention is particularly advantageous when the channel has a thin thickness, which is the case when the stacks are formed on a substrate of the SOI or FDSOI type.

The method according to the invention is as such compatible with the subsequent steps which are conventional in order to finalize the realization of the transistors.

As such, the invention offers an effective solution, that is easy to industrialize and inexpensive for improving the performance and the service life of devices that have different characteristics, for example transistors of which the gate oxides have different thicknesses.

It is particularly advantageous for the realization of FDSOI transistors.

The invention however applies in particular to transistors formed on bulk substrates or on substrates of the PDSOI type.

Optionally, the invention can further have at least any one of the following optional features:

According to an embodiment, the first gate pattern is a first gate stack, and the second gate pattern is a second gate stack.

According to another embodiment, the first gate pattern is a sacrificial pattern and the second pattern is a sacrificial pattern. The method comprises, after said step of selective etching of modified portions, a step of replacing the first and second sacrificial patterns with patterns that respectively form a first gate stack and second gate stack.

According to another embodiment, each one of the first and second gate stacks comprises at least one insulating layer, typically a gate oxide, with the thickness of the insulating layer of the second stack being greater than the thickness of the insulating layer of the first stack.

According to an embodiment, the thickness of the gate oxide of the first stack is between 0 and 3 nm ($10^{-9}$ meters) and preferable between 0 and 1.5 nm.

According to an embodiment, the thickness of the gate oxide of the second stack is between 1.5 and 8 nm, preferably between 2 and 6 nm and preferably between 2 and 3.5 nm.

According to an embodiment the gate pattern is intended to form a gate for the transistor. The gate pattern is then functional. This is then a method that can be qualified as "gate first", i.e. in which the gate is carried out beforehand. According to another embodiment, the gate pattern is intended to be removed, after having formed the spacers, to then be replaced with a functional gate pattern. The gate pattern is then sacrificial. This is then a method that can be qualified as "gate last", i.e. in which the gate is carried out in a second step.

According to an embodiment, the method comprises, before the step of depositing the first and the second protective layer, a step of depositing on the first and second patterns of a third protective layer arranged under the first protective layer and covering the first and second patterns. The third protective layer is made of a material that allows for an etching of the material of the first protective layer selectively to the material of the third protective layer. The method comprises, after the anisotropic etching of the second protective layer selectively to the first protective layer: a step of etching the first protective layer selectively to the third protective layer in such a way as to remove on the first pattern the first protective layer and to retain the third protective layer.

According to an embodiment, the third protective layer is made of nitride, preferably of silicon nitride or of a material that has a dielectric constant less than 7. The third protective layer is made of a material identical to that of the second protective layer.

According to an embodiment, the method comprises, after the step of anisotropic etching of the second protective layer, a step of removing the first protective layer located on the top of the second pattern, on the first pattern and between the first and second patterns, by selective etching of the material of the first protective layer with regards to the material of the second protective layer and of the material of the third protective layer.

According to an embodiment, the method comprises, after the step of removing the first layer on the first pattern, a step of deposition of an encapsulation layer made of a material that has a dielectric constant less than or equal to 8 on at least the second pattern.

This step makes it possible to fill in an opening in the second protective layer of the second pattern and through which the first protective layer present on the sides of the second pattern is rendered accessible during the step of removal of the first protective layer on the top of the second pattern. This step as such makes it possible to encapsulate and therefore to protect the spacer formed by the first layer on the second pattern. As such, during an etching of a later cleaning, for example with a HF base, the spacer formed by the first protective layer on the sides of the second pattern is not degraded.

According to an embodiment, the substrate is of the semi-conductor-on-insulator type. Alternatively, this can be a bulk substrate.

According to an embodiment, the second protective layer is made of nitride, preferably of silicon nitride (SiN) and the first protective layer is an oxide, preferably silicon, oxide ($SiO_2$).

According to an embodiment, the step of isotropic etching of the second protective layer is a wet etching, preferably with a base of a solution of hot $H_3PO_4$.

According to an embodiment, the step of isotropic etching of the second protective layer is a dry etching, preferably using a fluorocarbon or fluorinated chemistry.

According to an embodiment, the dry etching is carried out in a plasma reactor in which a polarization voltage bias and/or the voltage of the source is pulsed. This makes it possible to improve the isotropy of the etching.

According to an embodiment, the removal of the masking layer is carried out by etching of the masking relatively to the first protective layer.

According to an embodiment, the etching of the masking layer is a dry etching with a reducing or oxidizing chemistry.

According to an embodiment, the masking layer is a resin. The removal of the masking layer comprises a dry etching, preferably with a base of a mixture of $N_2/H_2$, then a wet clean, preferably with a base of SC1 ($NH_4OH$—$H_2O_2$).

According to an embodiment, the anisotropic etching of the second protective layer selectively to the first protective layer is carried out after the step of removal of the masking layer.

Starting with the isotropic etching then carrying out the anisotropic etching offers the advantage of allowing for the release of the stress on the consumption of the layers such as the $SiO_2$ which must not be consumed during the etching of the protective layers.

Alternatively, the anisotropic etching of the second protective layer selectively to the first protective layer is carried out before said step of masking.

According to a particularly advantageous embodiment, at least one from the first, the second and the third protective layers is carried out via conformal deposition. Preferably, each one of the first, second and third protective layers is carried out via a conformal deposition.

According to an embodiment, the second protective layer is a nitride or a material that has a dielectric constant less than 7 and said step of anisotropic etching of the second protective layer comprises:

a step of protecting by the forming of a protective oxide film on the first and second patterns;

the anisotropic etching of the protective oxide film outside of the sides of the first and second patterns in such a way as to retain the protective oxide film only on the sides of the first and second patterns;

the etching of a portion at least of the second protective layer located on a top and on either side of the second pattern, with the etching being selective with regards to the protective oxide film located on the sides of the first and second patterns and of the first protective layer located on the top of the first pattern.

The formation of a protective oxide film makes it possible to effectively protect the second protective layer present on the sides of the second pattern during the etching of the second layer on the top of the second pattern.

Moreover, this step makes it possible to retain a portion at least of the first protective layer on the first pattern.

Moreover, also optionally, the invention can further have at least any one of the following optional features:

According to an embodiment, the method comprises a step of overetching in order to fully remove the second protective layer on the top of the second pattern, said overetching being selective of the second protective layer with regards to the first.

According to an embodiment, said overetching is an anisotropic etching that has a main direction of etching perpendicular to said substrate.

According to an embodiment, the second protective layer is made of nitride, preferably of silicon nitride (SiN) or from a material of which the dielectric constant is less than 7, the first protective layer is an oxide, preferably a silicon oxide (SiO2) and the protective oxide film is formed from a plasma with an oxygen base.

According to an embodiment, the method comprises, after the step of anisotropic etching of the second protective layer, a step of removing the first protective layer located on the top of the second pattern, on the first pattern and between the first and second patterns, by selective etching of the material of the first protective layer with regards to the material of the second protective layer According to an embodiment, the method then comprises a step of deposition of a third protective layer that covers the first and second patterns.

The invention shall be particularly advantageous for producing a microelectronic device comprising on the same substrate of the semi-conductor-on-insulator type at least one first transistor and at least one second transistor each having a gate pattern and spacers located on the sides of the patterns, each gate patterns comprises a gate stack that comprises at least one gate and an insulating layer located between the gate and an active layer of the substrate. The insulating layer of the gate of the second transistor has a thickness greater than that of the pattern of the first transistor. The spacers of the second transistor are thicker than the spacers of the first transistor.

Microelectronic device means any device made with means from microelectronics. In addition to the devices having a purely electronic purpose, these devices include, in particular, micromechanical or electromechanical devices (MEMS, NEMS . . . ) and optical or optoelectronic devices (MOEMS . . . ).

Optionally, the substrate is of the SOI type and preferably of the FDSOI type.

The other objects, features and advantages of the present invention will be clear after an examination of the following description and the accompanying drawings. It is understood that other advantages could be incorporated.

BRIEF DESCRIPTION OF THE DRAWINGS

The goals, objects, features and advantages of the invention will be better understood from the detailed description of an embodiment of the latter that is illustrated by the following accompanying drawings in which.

The drawings are given as examples and are not limiting to the invention. They are schematic representations of a principle intended to facilitate the understanding of the invention and are not necessarily on the scale of the practical applications. In particular the relative thicknesses of the various layers and films are not representative of reality.

DETAILED DESCRIPTION OF THE INVENTION

It is specified that in the context of the present invention, the terms "on", "is on top of", "covers" and "underlying" and the equivalents thereto do not necessarily mean "in contact with." Thus, for example, the deposition of a first layer on a second layer does not necessarily mean that the two layers are directly in contact with each other, but this means that the first layer at least partly covers the second layer while either being directly in contact with it or being separated from it by at least one other layer or at least one other element.

In reference to FIGS. 1 to 13, an example of the method according to the invention shall now be described.

Figure 1:
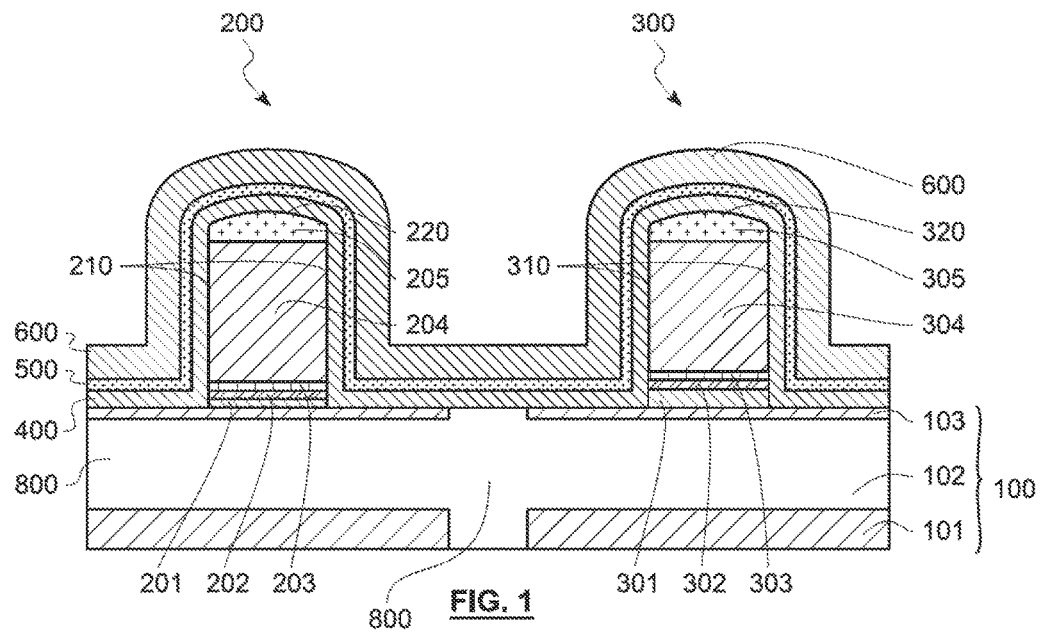
FIG. 1 diagrammatically shows an elaborated substrate comprising two gate patterns of which the gate oxides have different thicknesses.

FIG. 1 shows a structure starting from which the steps of the method according to the invention are implemented. This structure comprises transistors in the process of manufacture.

This structure comprises:

an elaborated substrate 100 of the semi-conductor-on-insulator (SOI) type and preferably of the silicon-on-insulator type. In the example shown this elaborated substrate 100 successively comprises a support layer 101; for example made of monocrystalline, polycrystalline or amorphous silicon; an insulating layer 102, usually qualified as buried oxide (BOX) and a semi-conductor active layer 103 intended to form a conduction channel of a transistor. The latter is for example made of silicon (Si), of germanium (Ge) or of silicon-germanium (SiGe), preferably monocrystalline. Preferably, the thickness of the active layer 103 forming a conduction channel for the transistor is between 4 and 11 nm ($10^{-9}$ meters) and preferably between 6 and 8 nm.

gate patterns 200, 300. In the example shown, which is non-limiting, the patterns 200, 300, of gate each form a stack of several layers. These patterns 200, 300 are intended to be retained in the final transistors (method of the gate first type). According to an alternative embodiment not shown, the gate patterns 200, 300 are sacrificial patterns which are intended to be removed after the realization of the spacers, then to be replaced with another gate forming preferably a stack (method of the gate last type). The invention covers this alternative embodiment.

In the rest of the description, which shows an embodiment of the gate first type in reference to the figures, the term stack as well as pattern will be used.

Typically, gate stacks each comprise at least one gate 204, 304 usually made of polycrystalline silicon or of metal and an insulating layer usually qualified as gate oxide 201, 301 located under the gate 204, 304 and through which an electric field will be able to develop in order to create an underlying conduction channel between source and drain when a sufficient voltage is applied on the gate 204, 304.

Preferably, the gate stack also comprises:

a metal layer often qualified as metal gate 203, 303 and located between the gate 204, 304 and the gate oxide 201, 301;

a dielectric layer 202, 302, referred to as "high-k", i.e. made of a material with high permittivity. This layer is located between the gate oxide 201, 301 and the metal gate 203, 303.

a hard protective mask 205, 305 that will be removed later in order to allow for contact to resume on the gate 204, 304. This hard mask 205, 305, which remains in place after the etching of the gate 204, 304, is typically made of SiO2 or of silicon nitride (SiN). Its role is to protect the top of the gate 204, 304 from any damage during the realization of the following steps and in particular those for etching spacers. There is a thin layer of oxide between the polycrystalline silicon of the gate and the hard nitride mask.

Preferably, the insulating gate oxide layer 201, 301 is arranged in contact with the active layer 103 that forms the conduction channel and in contact with the high permittivity layer 202, 302. Preferably, the metal layer 203, 303 is arranged in contact with the high permittivity layer 202, 302 and in contact with the gate 204, 304.

According to another embodiment the metal layer 203, 303 and/or the high permittivity layer 202, 302 are absent.

According to another embodiment, the hard mask 205, 305 and a protective layer 400 detailed in what follows are both formed from silicon nitride (SiN).

The same elaborated substrate 100 supports a plurality of transistors and therefore gate stacks. For certain applications, it is necessary to have transistors of which the properties are different. As such, certain transistors must have a gate oxide 301 of which the thickness is greater than that of the gate oxide 201 of other transistors.

FIG. 1 as such shows a gate stack 300 of which the thickness of the gate oxide 301 is greater than that of the oxide of the gate 201 of the stack 200.

As a non-limiting example, it is as such possible to have on the same elaborated substrate 100:

transistors of which the gate oxide has a thickness between 0 and 1.5 nm. These transistors are known to operate at a voltage Vdd between 0.8V and 1V. These transistors are sometimes qualified as SG or GO1. The thickness of the spacers is measured perpendicularly to the plane that contains the sides 210, 310 of the gates 204, 304, i.e. in this example, according to a direction parallel to the main plan wherein the substrate 100 extends. This thickness is therefore measured horizontally in the figures.

transistors of which the gate oxide has a thickness between 2 and 5 nm, and most often between 2 and 3.5 nm. These transistors are known to operate at a voltage Vdd between 1.5V and 3.5V. As such the breakdown voltage for these transistors is higher than the maximum voltage applied to the gate oxide. These transistors are sometimes qualified as EG or GO2.

transistors of which the gate oxide has a thickness between 3 and 6 nm, are known to operate at a Vdd voltage greater than 3V. As such the breakdown voltage for these transistors is higher than the maximum voltage applied to the gate oxide. These transistors are sometimes qualified as ZG or GO3.

The structure shown in FIG. 1 also shows the presence of trench insulation 800 passing through the entire active layer 103 in order to insulate two adjacent transistors. These trench insulation 800 extend through the entire thickness of the active layer 103 and to the support layer 101. These trench insulation are typically made from oxide, typically SiO2.

The structure shown in FIG. 1 also shows the presence of protective layers intended to form spacers on the sides 210, 310 of the gates 204, 304.

These protective layers 400, 500, 600 number three in this embodiment. However, it is possible to have only two or have four or more.

In order to maintain high performance, in particular at the level of the transistors of which the gate oxides are thin, it is necessary to have thin spacers.

Typically, for transistors of which the gate oxides 201 have a thickness of about 0 to 1.5 nm, the total thickness of the layers forming a spacer on the sides of the stacks 200 of gates must preferably have a thickness less than 9 nm.

Moreover, in order to limit the complexity of the methods and to limit the cost thereof, it is preferable that the spacers of transistors of two different types be carried out during the same steps.

This results in that, in the known methods, the spacers of the transistors that have thicker gate oxides are also less than 9 nm.

In the framework of the development of this invention, it has been identified that this thickness often leads to a breakdown on the spacers of the transistors with a thick gate oxide, deteriorating because of this the reliability and the service life of the devices that integrate this type of transistors.

The following steps make it possible to overcome this problem by forming thicker spacers on the sides 310 of the stacks 300 of which the gate oxide 301 is thicker, while still limiting the complexity of the method.

The protective layers shown in FIG. 1 comprise:

A protective layer 400, usually qualified as "spacer 0". It is for example made of silicon nitride (SiN) or from a material with a low dielectric constant (k less than 7). It can for example be made from a porous material. In the framework of this invention, the term porous layer designates a layer of which the presence of a void in the film is greater than 5% and preferably between 5 and 10%.

This protective layer 400 has a thickness between 3 and 10 nm without this being limiting and preferably of about 4 to 8 nm.

A protective layer 500, usually qualified as "spacer 1". This layer has a thickness between 2 and 6 nm without this being limiting and preferably about 3 nm. It is for example made of oxide, for example of silicon oxide (SiO2 and more generally (SixOy). This layer is preferably obtained by deposition. Advantageously, in order to thicken the oxide, a thermal annealing step is carried out, for example of the spike anneal type. Such a step makes it possible to have a high temperature over a very short period of time (maximum one second). The thickening of the oxide can also be done naturally during the deposition of the layer 600, which is typically carried out at a temperature of about 630° C. over a duration exceeding 10 minutes.

A protective layer 600, usually qualified as "spacer 2". This layer has a thickness between 2 and 18 nm without this being limiting and preferably about 10 nm. It is for example made of silicon nitride (SiN) or from a material with a low dielectric constant (k less than 7). It can for example be made from a porous material.

The layers 400 and 600, when they are made of a low-k material, i.e. with a low permittivity, generally comprise at least one of the following species or a combination of these species: silicon (Si), carbon (C), boron (B), nitrogen (N), hydrogen (H). They are for example formed in one of the following materials: SiCO, SiC, SiCN, SiOCN or SiCBN. These layers are porous or not.

The dielectric constant of these layers is measured for example using the conventional so-called mercury drop method.

The layers 400, 500, 600 are all obtained by conformal deposition, i.e. they have a constant thickness over the entire wafer and in particular on the sides 210, 310 and the tops 220, 320 of the gate stacks 200, 300 as well as outside the gate stacks 200, 300.

Figure 2:
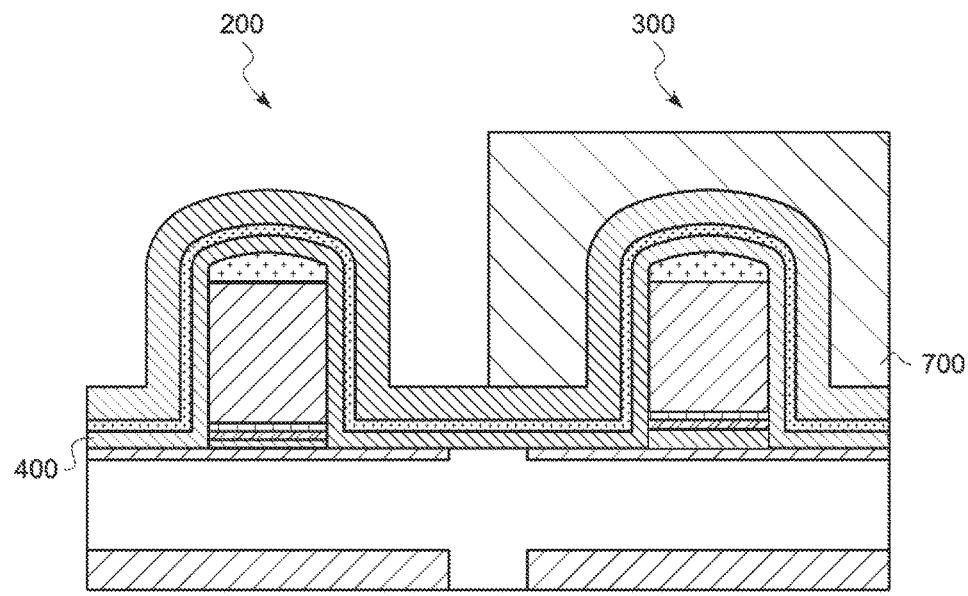
FIGS. 2 to 12 show steps of an embodiment of the method according to the invention.

FIG. 2 shows a following step during which a masking layer 700 is formed to fully cover the second gate stack 300, i.e. the one that has a gate oxide thickness 301 greater than that of the first stack 200. This masking layer 700 is typically a layer of resin, deposited full wafer, then open at the level of the first stack 200 by one of the conventional techniques of lithography.

In the framework of this invention, a resin is qualified as an organic and organo-mineral material that can be shaped by an exposure to a beam of electrons, photons or X-rays or mechanically.

Figure 3:
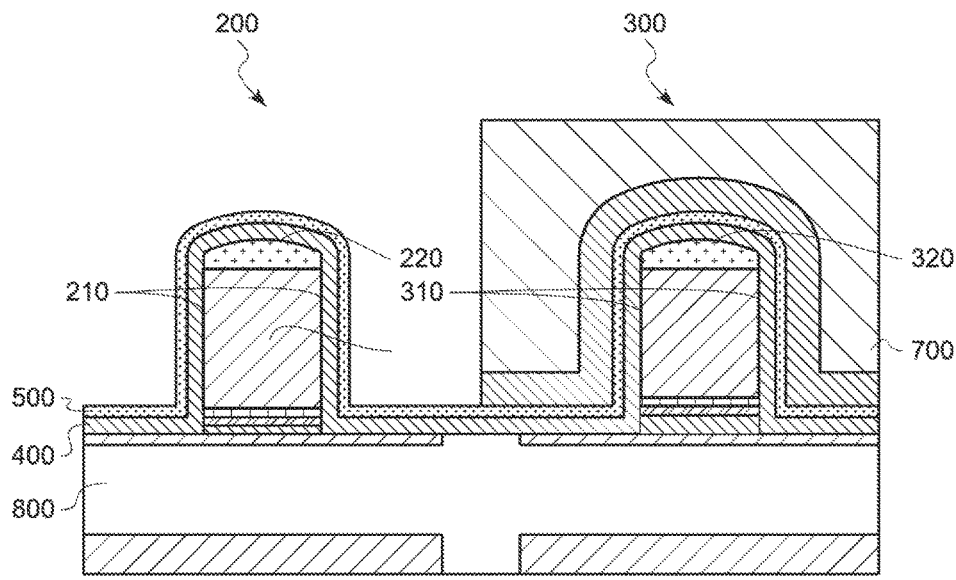

The following step, of which the result is shown in 3, aims to remove the second protective layer 600 that covers the first gate stack 200. As shown in FIG. 3, this step is preferably carried out in such a way as to entirely remove the portion of the second protective layer 600 which is located on the first gate pattern 200.

For this, an etching of this layer 600 is carried out without etching the first protective layer 500. Moreover, the second protective layer 600, protected by the masking layer 700, remains in place.

For example, if the first protective layer 500 is made of SiO2 and the second protective layer 600 is made of silicon nitride, this latter layer will be removed selectively to the first protective layer 500 by wet etching, for example with a solution with a base of H3PO4. It is also possible and is preferable to remove the second protective layer 600 via a dry etching carried out for example in an inductively coupled plasma (ICP), capacitive (CCP) or microwave reactor. If this layer 600 is made of SiN or from a material with a dielectric constant less than 7, a fluorine-based chemistry such as a fluorinated or fluorocarbon chemistry will for example be used. This type of etching makes it possible to be very selective with regards to SiO2 which is a good candidate for the first protective layer 500. Preferably the parameters will be adjusted in order to obtain an isotropic etching. The polarization voltage (bias) will be lowered in the case of a inductively coupled or capacitive plasma. The polarization voltage and/or the voltage of the source could also be pulsed in order to improve the isotropy of the etching.

As an example, the fluorinated chemistry can be with a base of CxFyHz, SF6 or NF3 diluted or not with other gases such as HBr, N2, Ar, He, H2, CxHyHz. For example an etching carried out in an inductively coupled reactor will be chosen, for a pressure of 90 mTorr, 600 W of source power, 50 sccm of SF6, 50 sccm of HBr, temperature of the substrate of 60° C., the time will have to be adjusted according to the thickness of the nitride to be etched.

Figure 4:
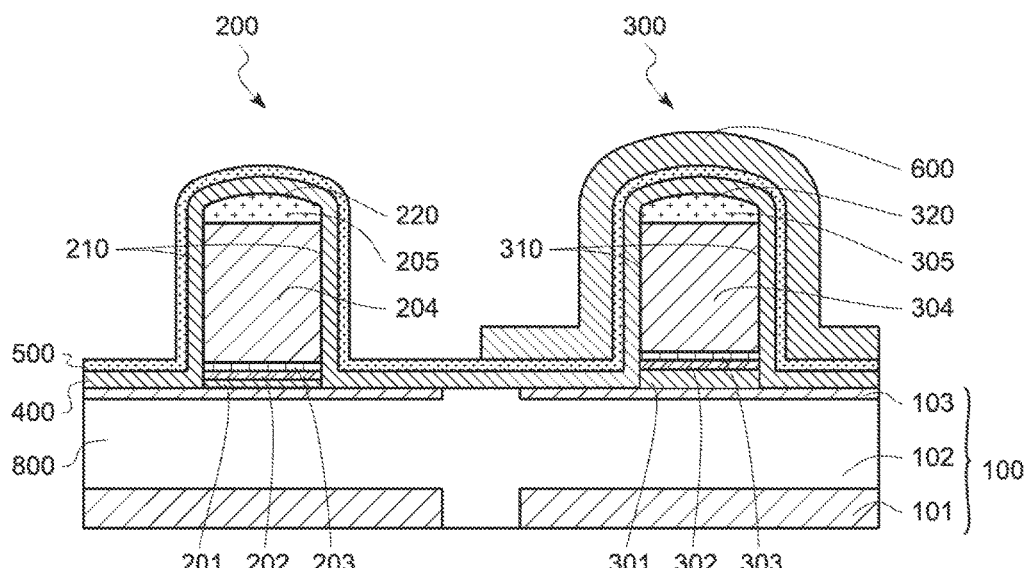

As shown in FIG. 4, the masking layer 700 is then removed. Naturally, this removal is selective of the material of the first layer 500 in order to retain the latter on the first stack 200. When this masking layer 700 is a photosensitive resin, it is for example removed in a capacitively coupled plasma, or inductively coupled plasma, or microwave reactor by using a reducing or oxidizing chemistry. For example, a gaseous mixture of N2 and H2 can be injected into a plasma reactor for the etching, then carry out a wet clean in order to remove the resin residue. This cleaning can be carried out using a solution SC1.

At this stage, the initial thickness of the first layer 500 is retained entirely or is at most very little consumed.

Figure 5:
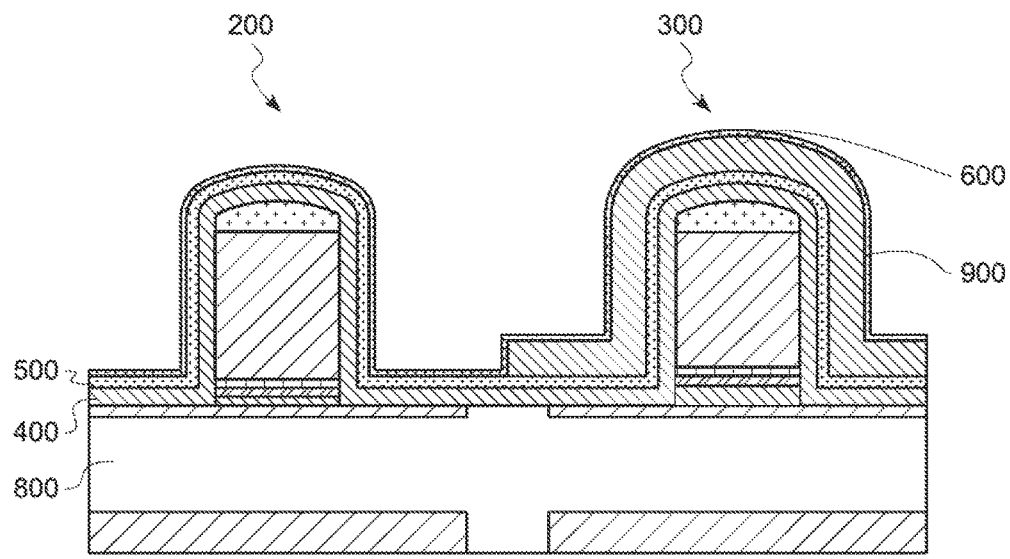
Figure 6:
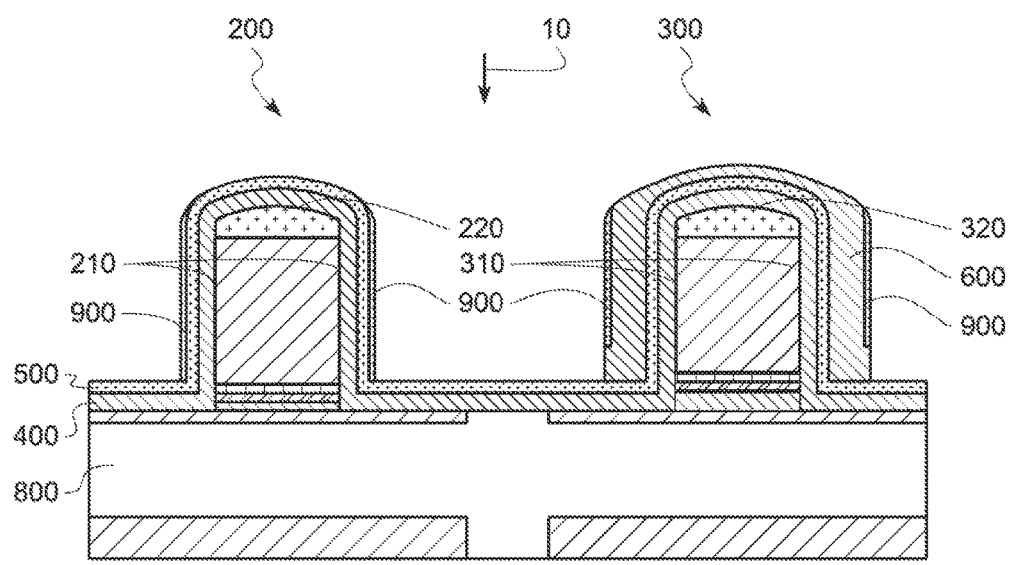
Figure 7:
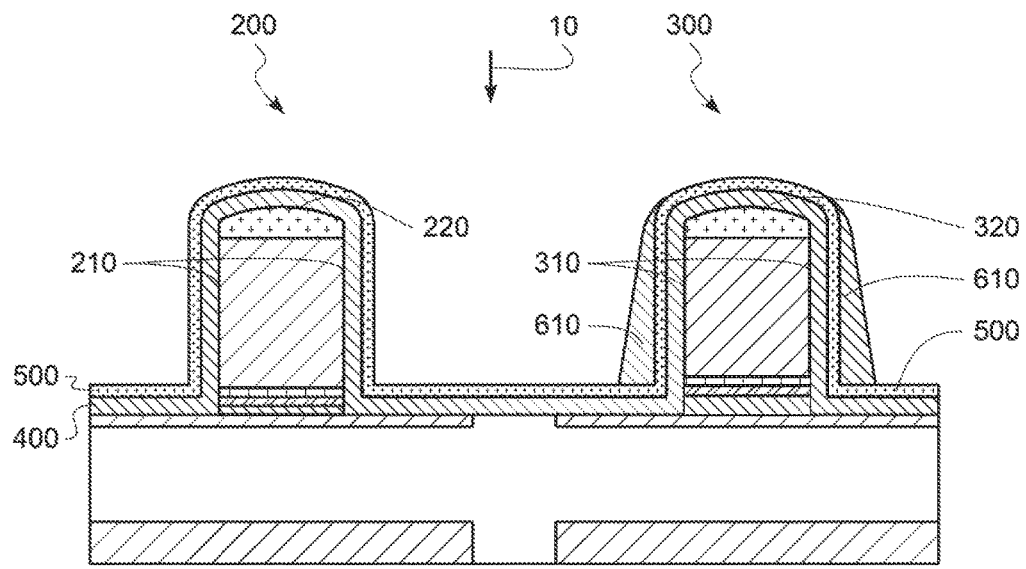

FIGS. 5 to 7 aim to anisotropically etch the second layer 600 in order to suppress or reduce the thickness of this layer 600 on the top 320 of the second stack 300 while still retaining a high thickness of this layer 600 on the its flanks 310 and without significantly altering the first protective layer 500.

FIG. 5 shows an advantageous but solely optional step. It aims to protect the second protective layer 600 on the sides 310 of the second stack 300. For this, a protective oxide film 900 is formed on the surface of this layer 500. For example, O2 is injected into a ICP or CCP plasma reactor with the following parameters:

Pressure: 10 milli Torr
Power of the source: 1000 Watts
O2 flow rate: 200 sccm (cubic centimeters per minute in standard conditions of pressure and temperature). Typically a flow rate is measured with a flow meter associated with the reactor.
Temperature of the substrate 60° C.
Duration: 30 seconds These conditions provoke the formation of an oxide film 900 of about 1 to 2 nm on the surface of the wafer, i.e. on the surface of the second protective layer 600 as well as on the surface of the first protective layer 500.

FIG. 6 shows a step of anisotropic etching carried out according to the favored direction 10 which is perpendicular to the main plane wherein the substrate 100 extends. As such, during this anisotropic etching, the protective film 900, if it is present, is removed on the surfaces parallel to the main plane wherein the substrate 100 extends. This protective film 900 is removed from the tops 220, 320 of the stacks 200, 300 and between the stacks 200, 300.

This anisotropic etching also removes a portion of the thickness of the second protective layer 600 located on the top 320 of the second stack 300.

This etching etches the second protective layer 600 much more quickly than the first protective layer 500, to the extent that at the end of this anisotropic etching, the thickness of the first protective layer 500 is not consumed at all or is etched only partially on the top 220 of the first stack 200.

For example, the anisotropic etching removes all of the protective film 900 on the top 220, 320 of the stacks 200, 300 and between the latter and consumes about 3 nm of the second protective layer 600 on the top 320 of the second element 300. It then remains a thickness of 1 nm of the second layer 600 on the top 320.

FIG. 7 shows a step of overetching in order to remove the thickness of the second protective layer 600 which subsists on the top 320 of the second stack 300. This residual thickness is about 1 nm in this non-limiting example. This etching is selective of the material of this layer 600 with regards to that of the first layer 500 that is not or only very little consumed. As shown in FIG. 7, the second layer 600 is then removed everywhere except for the sides 310 of the second stack 300. The residual portions 610 of the second layer of protection 600 then form spacers 610. This etching is preferably anisotropic.

Note that according to an embodiment of the method we pass directly from the step shown in FIG. 4 to the step shown in FIG. 7. Such is in particular the case when the protective film 900 is not carried out. According to this simplified embodiment, an anisotropic etching is directly carried out from the step shown in FIG. 4 in order to obtain the structure shown in FIG. 7. Alternatively, it is possible, always, without producing the protective film 900, to carry out an anisotropic etching of the second protective layer 600 and to carry out, before or after this etching, an isotropic etching of the second protective layer 600.

Note that the etching carried out in such a way as to remove the second protective layer 600 on the top of the second pattern 300, can possibly lead, to consuming a portion of the thickness of the first protective layer 500 located on the first gate stack 200 and in particular on the top of the latter. However this partial consumption is not detrimental since, as shall be explained in what follows, the etching of the first protective layer 500 is highly selective with regards to material of the third protective layer 400. Such is for example the case when the first protective layer 500 is made of silicon oxide SixOy and the third protective layer 400 is made of silicon nitride SixNy. Consequently, during the removal of the first protective layer 500 on the first and second gate patterns 200, 300 the etching will stop simultaneously on these two patterns 200,300 and without consuming the third protective layer 400 on the first pattern 200.

Figure 8:
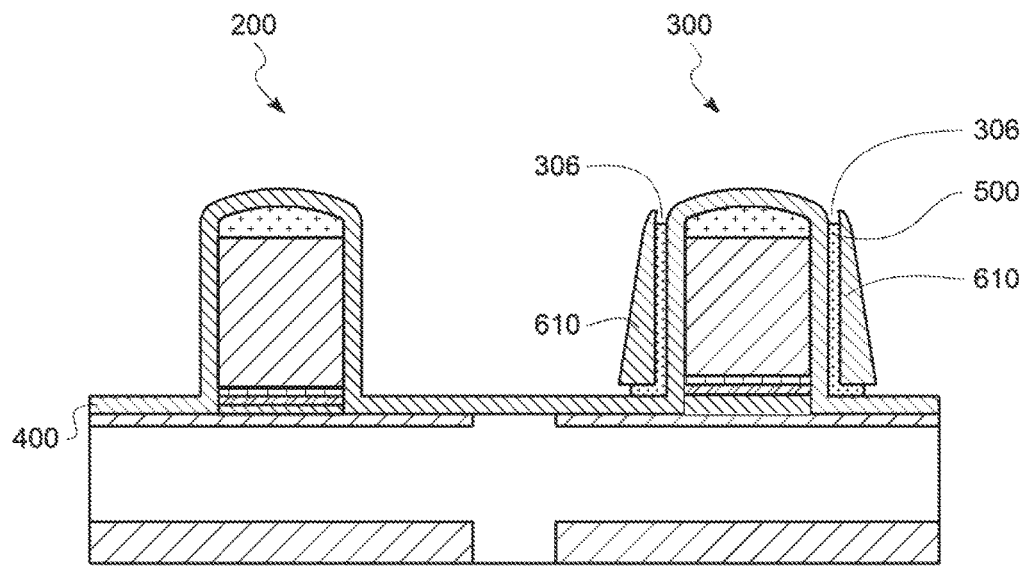

FIG. 8 shows the removal of the first protective layer 500. This removal allows the third protective layer 400, intended to form the spacers for the first stack 200, i.e. the stack having a low gate oxide thickness 201.

Particularly advantageously, the second protective layer 500 is entirely removed at least on the first stack or pattern 200. Consequently, the sides 210 of the first pattern 200 are covered by the third protective layer 400 and preferable solely by this third protective layer 400. This makes it possible to preserve the thickness of the standard spacer formed by the third protective layer 400. This makes it possible in particular to not have to modify the standard method concerning the particularly critical steps in defining the thickness of the spacer on the gate stacks of which the sides are covered by a single-layer spacer.

In the case where the first protective layer 500 is an oxide such as SiO2, this removal is advantageously carried out by wet etching, for example with a diluted solution of HF.

This etching etches the first layer 500 selectively to the spacers 610 of the second layer 600 and to the third layer 400, to the extent that the latter is only very little and preferably not at all etched.

It results from this step that the light cavities 306 can appear between the spacers 610 and the third layer 400 where the first layer 500 is accessible.

Figure 9:
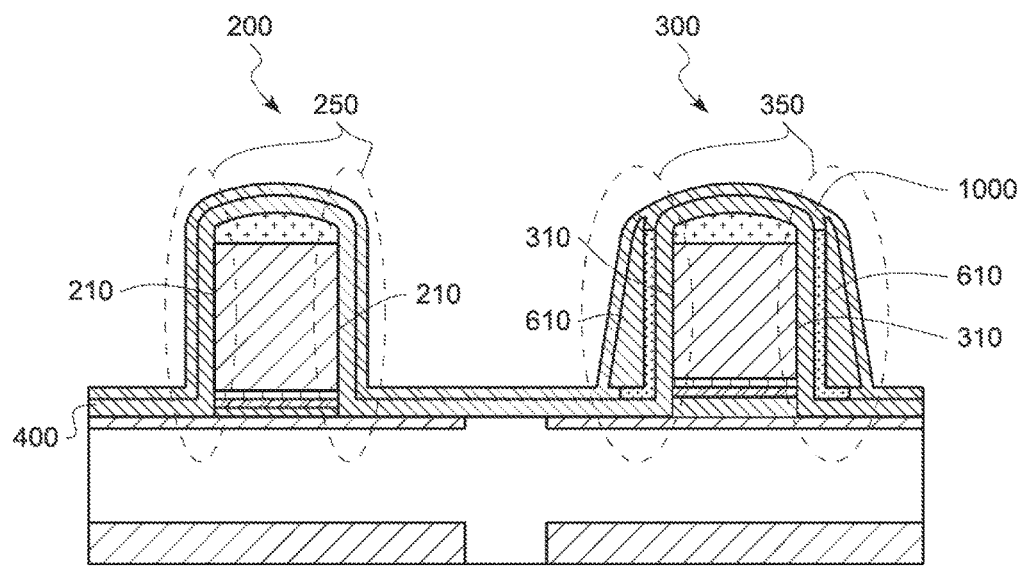

As shown in FIG. 9, in order to protect the first protective layer 500, it can be provided to encapsulate the latter by forming an encapsulation layer 1000 that fills in these cavities 306.

This encapsulation layer 1000 is for example a layer of nitride (SiN for example) or a low-k level i.e. of which the dielectric constant is less than 7.

In this case, the thickness of the third protective layer 400 must be chosen to obtain, after deposition of the encapsulation layer 1000, the desired thickness for protecting the sides 210 of the first stack 200.

As shown in FIG. 9, the first stack 200 has on its sides 210 spacers 250 comprised by the following layers:
  Third protective layer 400 and optionally the encapsulation layer 1000;

The second stack 300 has on its sides 310 spacers 250 comprised of the following layers:
  Third protective layer 400, first protective layer 500, spacers 610 formed by the second protective layer 600 and optionally the encapsulation layer 1000. As such the sides 310 of the gate stack 300 that have a gate oxide 301 that is thicker are protected by a spacer thickness that is much greater than the sides 210 of the stack 200 wherein the gate oxide 201 is thin.

Note that the structure obtained has for advantage that the active layer 103 is, outside of the gate stacks 200, 300, overmounted by a layer 400 of a constant thickness on the wafer. Consequently, the same anisotropic etching of 30 the third protective layer 400 makes it possible to remove the latter on either side of the stacks 200, 300 in order to expose the active layer 103 for the purpose of forming the source and drain, typically by epitaxy using the active layer 103. The fact that before the etching this third layer 400 has a constant thickness makes it possible to control its etching in order to remove it entirely but without altering the underlying active layer 103.

For example, in order to remove the third protective layer 400 between the stacks 200, 300, it is possible to carry out the following steps, if this layer 400 is made of silicon nitride (SiN) or of a low-k material.

Figure 10:
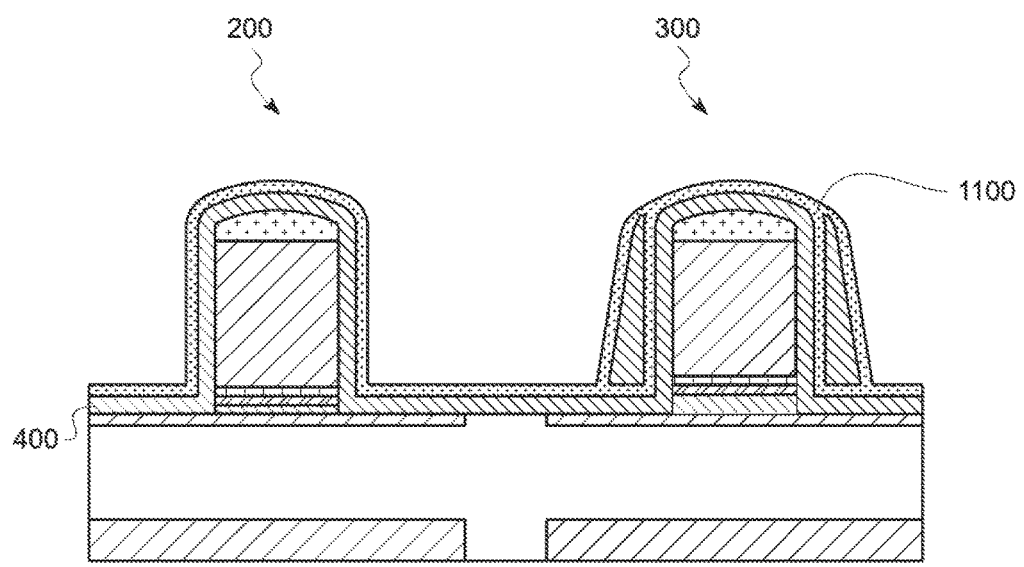

Deposition of a protective film 1100 as shown in FIG. 10.
  In this figure, for reasons of clarity, the optional encapsulation layer 1000 is not shown. Naturally if this encapsulation layer 1000 is formed as shown in FIG. 9 it will be present under the protective film 1100. This protective film 1100 is for example obtained by plasma deposition of an oxide film over the entire wafer. Preferably, this protective film 1100 is carried out in the same reactor as the subsequent anisotropic etching of the third protective layer 400. It covers the sides 210, 310, the tops 220, 320 of the gate stacks 200, 300 as well as the regions between the stacks 200, 300.

Figure 11:
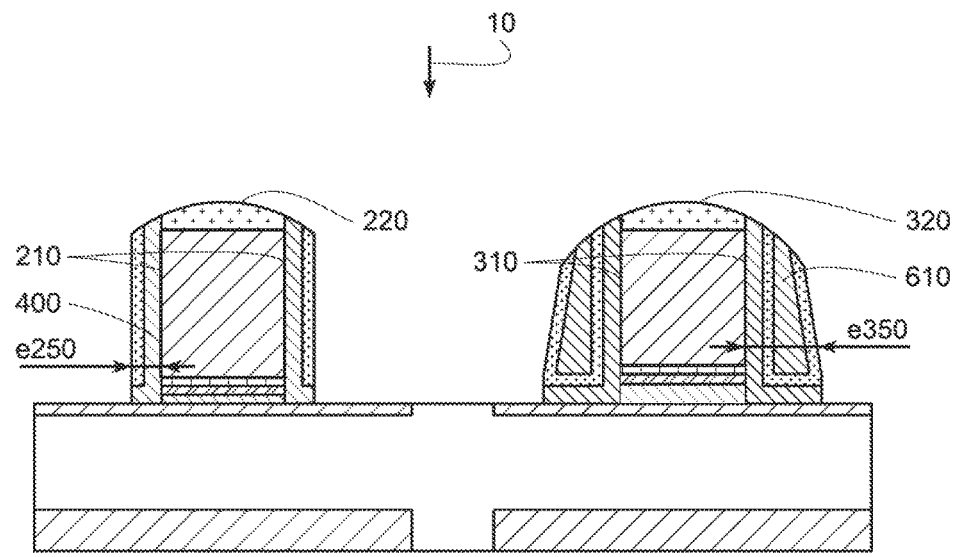

For example, the following conditions are applied in the plasma reactor of the ICP type:

Pressure: 10 milli Torr
Power of the source: 1000 Watts
O2 flow rate: 200 sccm
Temperature of the substrate 60° C.
Removal of the protective film 1100 in the bottom of the structure and consequently on the tops 220, 320 of the stacks 200, 300 by retaining it on the sides 210, 310. This step is illustrated in FIG. 11.

This removal preferably comprises an anisotropic etching according to a favored direction 10 parallel to the sides 210, 310. This etching is for example carried out using a fluorinated or fluorocarbon plasma. The conditions can for example be the following:

Main Etching:
Pressure: 5 milli Torr
Power of the source: 300 Watts
Polarization voltage (bias): 65 volts
Flow rate of $CHF_3$: 30 sccm
Flow rate of He: 220 sccm
Temperature 110° C.

With these conditions the etching speed of the third protective layer 400 made of silicon nitride is about 30 nm/min.

A step of overetching can then be carried out selective to Si and $SiO2$, for example with the following conditions
Pressure: 90 milli Torr
Power of the source: 400 Watts
Polarization voltage (bias) Vb: 250 volts
Flow rate of $CHF_3$: 200 sccm
Flow rate of $O_2$: 200 sccm
Flow rate of He: 120 sccm
Flow rate of CH4: 20 sccm
Temperature of the substrate 60° C.
Pulsation of the polarization (bias) 50%
Frequency 500 Hz
Removal of the material of the third protective layer 400 selectively to the protective film 1000 made of oxide. This etching must be highly selective with regards to the protective film 1100 so that the latter effectively protects the spacers that are already formed. This etching is also highly selective with respect to the material of the active layer 103 intended to form the channel so as to not consume or degrade the latter.

As the etching does not have an infinite selectivity with respect to the protective film 1100, the latter is despite this consumed during the etching. This film 1100 however allows for better control of the size by delaying the effect of the lateral attack, and this even for an anisotropic etching.

At this stage of the method, there are thicknesses of the first protective layer 500, the second protective layer 600 and the third protective layer 400 only on the sides 310 of the second stack 300. Moreover, on the sides 210 of the first stack 200 only the third layer 400 remains.

Figure 13:
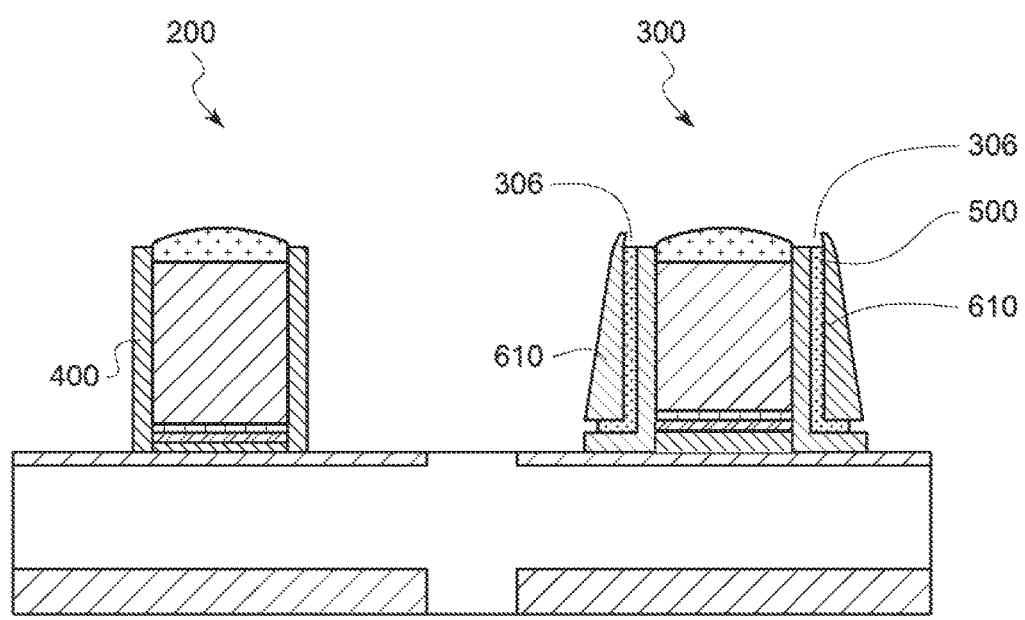
FIG. 13 shows a step of an alternative embodiment.

According to another embodiment, the steps described in reference to FIGS. 9 and 10 are replaced with a step of anisotropic etching of the third protective layer 400 according to the favored direction 10. Consequently, according to this embodiment, the step shown in FIG. 13 follows the step shown in FIG. 8. This etching is a dry etching. The result of this etching is shown in FIG. 13. The third protective layer 400 is removed on the tops and between the stacks 200, 300. On the other hand it subsists on the sides 210 of the first stack 200 (as well as on the sides 310 of the second stack 300 since the latter are covered by the other spacers formed by the first 500 and second 600 layers). The steps mentioned hereinbelow can be carried out using the result from the step shown in FIG. 13. This embodiment in particular has for advantage to reduce the number of steps and as such to be less expensive.

As shown in FIG. 13, the third protective layer 400 is intended to form a spacer that will be retained on the sides of the first gate stack 200 during the operation of the transistor. The third protective layer 400 as such forms functional spacers.

Concerning the second gate stack 300, the spacers formed by the first 500; second 600 and third 400 layers are retained. As such, these layers form functional spacers. They Will preferably be present on this second gate stack 300 in the final transistor final.

At this stage of the method, the total thicknesses of the spacers are for example, as follows:
First stack 200 with thin gate oxide 201: e250=6 nm
Second stack 300 with thick gate oxide 301 e350=20 nm.

As shown in FIG. 11, these thicknesses are taken perpendicularly to the main plane wherein the sides 210, 310 of the gate stacks 200, 300 extend As such the total spacer thickness for transistors with thick gate oxide is about three times as high than for transistors with a thin gate oxide. This makes it possible to prevent the risks of breakdown.

Advantageously but solely optionally, a doping is carried out by inclined implantation (tilted doing) of the sides of the stack 300 that presents a thicker gate oxide in order to dope the region of the layer 103 located under the spacer. This doping makes it possible to retain or improve the performance of this transistor. This doping comprises, for example, the implantation of species Arsenic (As), Phosphorus (P) for an N-type transistor, or Boron (B), boron difluoride (BF2), or Indium for a transistor of the P type in the region the channel located under the thicker spacer.

The spacers are formed on either side of the stacks 200, 300. Conventional steps can then be implemented in order finalize the realization of the transistors.

Figure 12:
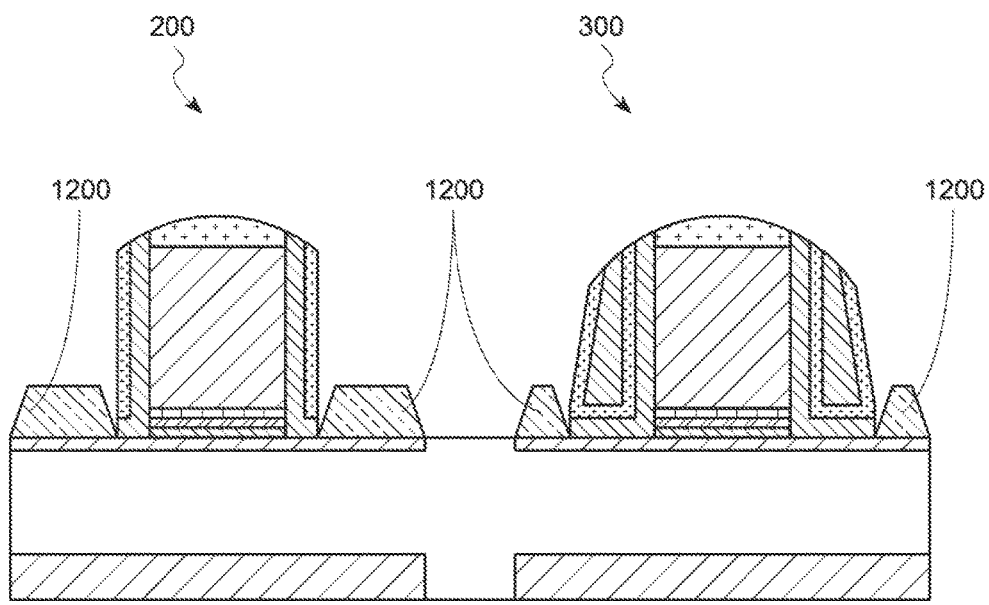

Among these conventional steps, it can be provided for example the growth of the source and drain 1200 by epitaxy using the active layer 103 as shown in FIG. 12. It will also be provided, according to the applications, the protection of the transistors of the P (or N) type by deposition of a resin. This step is preferably carried out before the formation of the protective oxide film 1100 shown in FIG. 10.

In light of the preceding description, it clearly appears that the method according to the method makes it possible to improve the service life of the devices that integrate on the same chip transistors of which the gate thicknesses are different, without however substantially increasing the complexity of the manufacture of the method.

The invention is not limited to the embodiments described above and extends to all the embodiments covered by the claims.

For example the order of certain steps can be inversed. For example the step of anisotropic etching of the second protective layer 600 can be carried out before masking of the second stack 300. In this case, the second protective layer 600 is removed, entirely or partially, on the tops 220, 320 of the two stacks 200, 300. This layer is on the other hand retained on the two sides 210, 310 of the two stacks 200, 300. After this anisotropic etching, the step of masking the second stack 300 is carried out in order to allow for the isotropic etching of the second layer 600 that coves the first stack 200, in particular on its sides 210.

Figure 14:
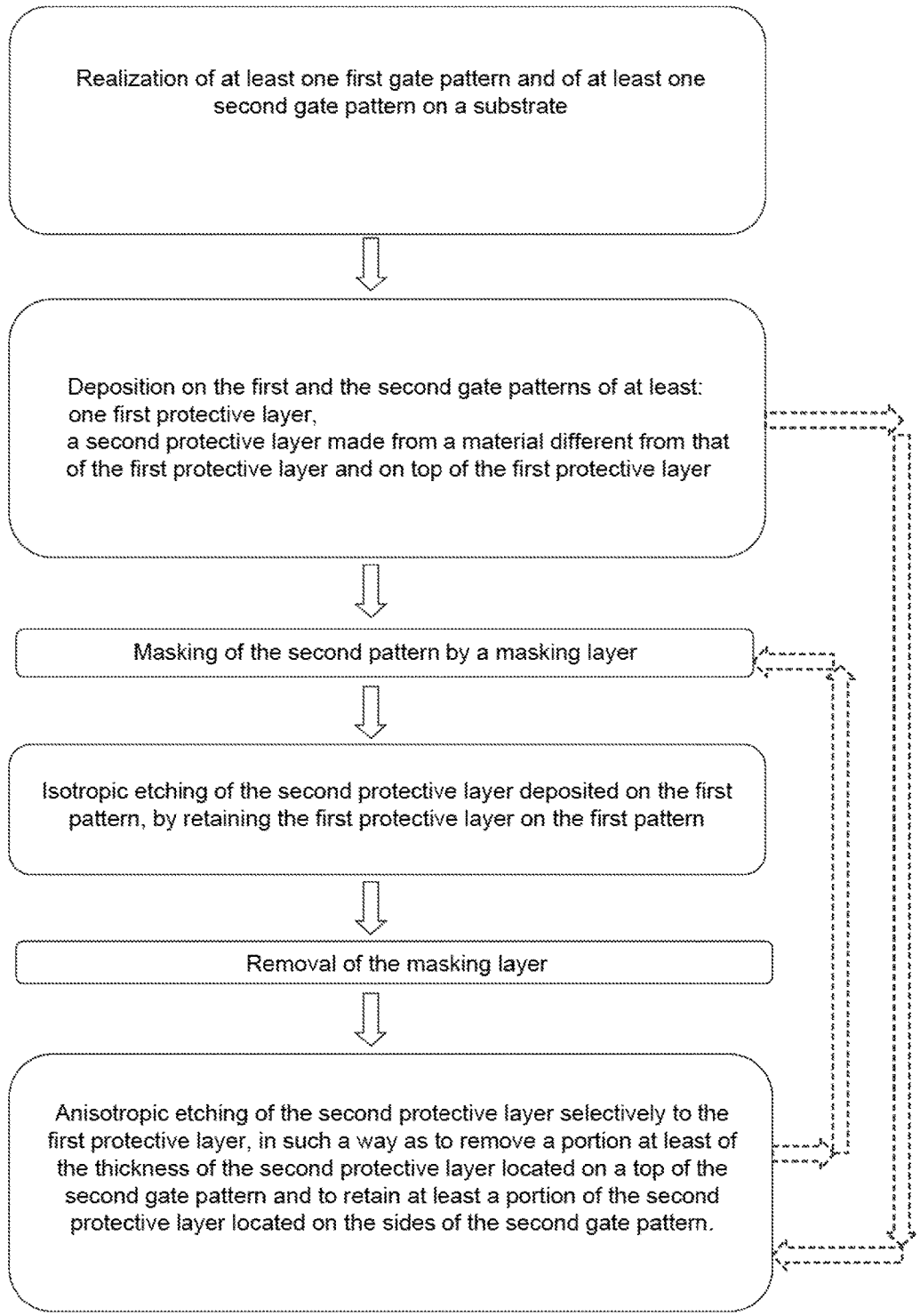
FIG. 14 summarizes certain steps of two examples of the method according to the invention.

This alternative embodiment is shown in FIG. 14 by dotted arrows.

The details, examples and advantages of the steps of the embodiment described in detail in reference to FIGS. 1 to 12 apply to this alternative embodiment in which the step of anisotropic etching of the second protective layer 600 is carried out before masking of the second stack 300.

With respect to the embodiment shown in the figures, this alternative embodiment has the following advantages:

Although the invention is particularly advantageous for producing on the same substrate transistors of which the gate stack have insulating layers (typically a gate oxide layer) of different thicknesses, this is not limiting. Indeed the invention also applies to the realization on the same substrate of transistors of which the gate stacks have insulating layers of identical thicknesses.

Moreover, in the embodiments shown, the gate stack is carried prior to the steps of the invention. These figures as such show a method of the gate first type.

According to another embodiment covered by the invention, the functional gate stack is carried after the steps of the invention. The gate stack whereon is deposited the first protective layer therefore forms a sacrificial pattern that will be removed, once the spacers are produced. This alternative embodiment is as such a method of the gate last type.

REFERENCES

100 Elaborated substrate
101 Support layer
102 Insulating layer
103 Active layer
200 First stack/Pattern
201 Insulating layer of the first stack
202 High-permittivity layer of the first stack
203 Metal gate of the first stack
204 Gate of the first stack
205 Hard mask of the first stack
210 Side of the first stack
220 Top of the first stack
250 Spacer of the first stack
300 Second stack/Pattern
301 Insulating layer of the second stack
302 High-permittivity layer of the second stack
303 Metal gate of the second stack
304 Gate of the second stack
305 Hard mask of the second stack
306 Cavity
310 Side of the second stack
320 Top of the second stack
350 Spacer of the second stack
400 Third protective layer
500 First protective layer
600 Second protective layer
610 Portion of the second protective layer
700 Masking layer
800 Trench insulation
900 Protective film
1000 Encapsulation layer
1100 Protective film
1200 Source/Drain

The invention claimed is:

1. A method for producing on same substrate of a semiconductor-on-insulator type or fully depleted semiconductor-on-insulator type at least one first transistor and at least one second transistor, the method comprising:
producing at least one first gate pattern and at least one second gate pattern on the substrate;
depositing, on the first and the second gate patterns, at least:
a first protective layer,
a second protective layer overlying the first protective layer and made of a material different from that of the first protective layer, and
a third protective layer surmounted by the first protective layer and the second protective layer, the third protective layer being lade of a material allowing for selective etching of the material of the first protective layer relative to the material of the third protective layer,
wherein the material of the second protective layer and the material of the third protective layer are each made of a material taken from the following materials: silicon nitride (SiN), materials for which a dielectric constant is less than 7, SiCO, SiC, SiCN, SiOCN, and SiCBN;
masking of the second gate pattern by a masking layer;
isotropic etching of the second protective layer on the first gate pattern, so as to fully remove the second protective layer on the first gate pattern, by preserving the first protective layer on the first gate pattern, the second gate pattern being masked by the masking layer during the isotropic etching;
removing the masking layer after the isotropic etching;
before the masking or after the removing of the masking layer, performing anisotropic etching of the second protective layer selectively relative to the first protective layer, so as to remove at least partially the second protective layer located on a top of the second gate pattern and to preserve at least a portion of a thickness of the second protective layer located on sides of the second gate pattern;
before the depositing of the first and the second protective layer, depositing on the first and second gate patterns, the third protective layer arranged under the first protective layer and covering the first and second gate patterns; and
after the anisotropic etching of the second protective layer selectively relative to the first protective layer, etching the first protective layer selectively relative to the third protective layer so as to remove on the first gate pattern the first protective layer and to preserve the third protective layer,
wherein the first protective layer is an oxide.

2. The method according to claim 1, wherein the first gate pattern is the first gate stack and wherein the second gate pattern is a second gate stack, each one of the first and second gate stacks comprises at least one insulating layer.

3. The method according to claim 2, wherein a thickness of the insulating layer of the second stack is greater than a thickness of the insulating layer of the first stack.

4. The method according to claim 3, wherein the thickness of the insulating layer of the first stack is between 0 nm and 3 nm.

5. The method according to claim 2, wherein the thickness of the insulating layer of the second stack is between 1.5 nm and 8 nm.

6. The method according to claim 1, wherein the first gate pattern is a first sacrificial pattern, wherein the second gate pattern is a second sacrificial pattern, the method further comprising, after the anisotropic etching of the second protective layer selectively relative to the first protective layer, a step of replacing the first and second sacrificial patterns with patterns forming respectively a first gate stack and a second gate stack, each one of the first and second gate stacks comprising at least one insulating layer.

7. The method according to claim 1, wherein the second protective layer and the third protective layer are porous.

8. The method according to claim 1, wherein the third protective layer has a thickness between 3 nm and 10 nm.

9. The method according to claim 1, wherein the third protective layer has a thickness between 4 nm and 8 nm.

10. The method according to claim 1, wherein the deposition of at least one of the first, the second, and the third protective layers is a conformal deposition.

11. The method according to claim 1, further comprising, after the anisotropic etching of the, second protective layer, a step of removing the first protective layer located on the top of the second gate pattern, on the first gate pattern, and between the first and second gate patterns, by selective etching of the material of the first protective layer towards the material of the second protective layer and towards the material of the third protective layer.

12. The method according to claim 11, further comprising, after the removing the first protective layer on the first gate pattern, a step of depositing a capping layer made of a material that has a dielectric constant less than or equal to 8 on at least the second gate pattern.

13. The method according to claim 1, wherein the first protective layer is made of $SiO_2$.

14. The method according to claim 1, wherein the isotropic etching of the second protective layer is a wet etching.

15. The method according to claim 1, wherein the isotropic etching of the second protective layer is a dry etching.

16. The method according to claim 1, wherein the anisotropic etching of the second protective layer selectively relative to the first protective layer is carried out after the step of removing the masking layer.

17. The method according to claim 1, wherein the anisotropic etching of the second protective layer selectively relative to the first protective layer is carried out before the step of masking.

18. The method according to claim 1, wherein the second protective layer is a nitride or a material that has a dielectric constant less than 7 and the anisotropic etching of the second protective layer further comprises:
   a step of protecting by forming an oxide protective film on the first and second gate patterns;
   anisotropic etching of the oxide protective film outside of sides of the first and second gate patterns so as to retain the oxide protective film only on the sides of the first and second gate patterns; and
   etching a portion at least of the second protective layer located on a top and on either side of the second gate patter, the etching being selective towards the oxide protective film located on the sides of the first and second gate patterns and towards the first protective layer located on a top of the first gate pattern.

19. The method according to claim 18, wherein the second protective layer is made of nitride, the first protective layer is an oxide, and the oxide protective film is formed from an oxygen-based plasma.

20. The method according to claim 1, wherein, before the performing the anisotropic etching of the second protective layer selectively relative to the first protective layer, the first protective layer is exposed on a top of the first gate pattern.

21. The method according to claim 1, wherein the performing the anisotropic etching of the second protective layer selectively relative to the first protective layer consumes a portion of the fast protective layer on a top of the first gate pattern.

* * * * *

UNITED STATES PATENT AND TRADEMARK OFFICE
CERTIFICATE OF CORRECTION

PATENT NO. : 10,347,545 B2
APPLICATION NO. : 15/599944
DATED : July 9, 2019
INVENTOR(S) : Laurent Grenouillet et al.

Page 1 of 1

It is certified that error appears in the above-identified patent and that said Letters Patent is hereby corrected as shown below:

On the Title Page

Item (73) the Assignee Information is incorrect. Item (73) should read:
-- (73) Assignee: Commissariat A L'Energie Atomique et aux Energies Alternatives, Paris (FR) --

Signed and Sealed this
Twenty-first Day of April, 2020

Andrei Iancu
*Director of the United States Patent and Trademark Office*